(12) United States Patent
Mitsuya (10) Patent No.: US 7,477,014 B2
(45) Date of Patent: Jan. 13, 2009

(54) ORGANIC ELECTROLUMINESCENT DEVICE AND OPTICAL DEVICE

(75) Inventor: Masayuki Mitsuya, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 11/468,553

(22) Filed: Aug. 30, 2006

(65) Prior Publication Data

US 2007/0075618 A1 Apr. 5, 2007

(30) Foreign Application Priority Data

Sep. 30, 2005 (JP) ............................. 2005-286415

(51) Int. Cl.
*H01J 63/04* (2006.01)
(52) U.S. Cl. ..................... 313/504; 313/292
(58) Field of Classification Search ......... 313/498–512, 313/292, 238; 445/24; 427/66
See application file for complete search history.

(56) References Cited

U.S. PATENT DOCUMENTS

| | | | | |
|---|---|---|---|---|
| 5,701,055 | A * | 12/1997 | Nagayama et al. | 313/504 |
| 6,369,495 | B2 * | 4/2002 | Codama et al. | 313/292 |
| 6,608,331 | B2 * | 8/2003 | Duineveld | 257/93 |
| 7,055,987 | B2 * | 6/2006 | Staufert | 362/252 |
| 7,081,704 | B2 * | 7/2006 | Yamazaki et al. | 313/500 |
| 2002/0017645 | A1 * | 2/2002 | Yamazaki et al. | 257/72 |
| 2002/0060518 | A1 * | 5/2002 | Duineveld et al. | 313/506 |
| 2002/0074931 | A1 * | 6/2002 | Liedenbaum | 313/493 |
| 2003/0164679 | A1 * | 9/2003 | Hamano et al. | 313/504 |
| 2004/0009303 | A1 * | 1/2004 | Ito et al. | 427/421 |
| 2005/0170076 | A1 * | 8/2005 | Seki et al. | 427/66 |
| 2005/0214983 | A1 * | 9/2005 | Maekawa | 438/149 |

FOREIGN PATENT DOCUMENTS

| | | |
|---|---|---|
| JP | A 10-153967 | 6/1998 |
| JP | A 2002-148429 | 5/2002 |
| JP | A 2002-252083 | 9/2002 |

* cited by examiner

*Primary Examiner*—Toan Ton
*Assistant Examiner*—Hana A Sanei
(74) *Attorney, Agent, or Firm*—Oliff & Berridge, PLC (57) ABSTRACT

Disclosed is an organic electroluminescent device including: a panel; a partition that defines a plurality of hollows arranged in an anisotropic form in a plan view on the panel; a luminescent portion formed by individually coating a coating solution containing an electroluminescent material on each of the plurality of hollows and drying out the coating liquid coated on the hollows; and a drain means that is formed in the partition to drain part of the coating liquid coated on the hollow so that a surface of the luminescent portion can be flattened.

4 Claims, 11 Drawing Sheets

ORGANIC ELECTROLUMINESCENT DEVICE AND OPTICAL DEVICE

BACKGROUND

1. Technical Field

The present invention relates to an organic electroluminescence device such as an organic electroluminescence display unit manufactured using, for example, an inkjet method and an optical device such as a color filter.

2. Related Art

In an organic electroluminescent device manufactured using an inkjet method, a low-molecular luminescent material or a polymer luminescent material is used to form an organic electroluminescent layer as a light-emitting layer. The luminescent layer formed of the low-molecular luminescent material is typically formed using a dry method such as a vacuum deposition method. For this reason, it is thought that it is difficult to form the luminescent layer made of a low-molecular material on a large panel in a uniform thickness. The luminescent layer made of a polymer material is typically formed by coating a coating solution obtained by diffusing and dissolving the polymer luminescent material in a solvent on a panel using a coating method such as a spin coat technique. Therefore, it has been thought that it is difficult to manufacture a full color display panel by coating a coating solution containing luminescent materials for each color.

In this situation, JP-A-10-153967 discloses an organic electroluminescent device capable of implementing a full-color display by coating organic electroluminescent materials having red and green colors using an inkjet method and depositing a luminescent material having a blue color on a predetermined area and the organic layers emitting red and green colors. This document also suggests that this organic electroluminescent display device can be applied to an organic electroluminescent display device manufactured on a large panel.

In addition, when the luminescent layer is formed using an inkjet method, a flat luminescent layer can be provided by coating a liquid droplet containing an organic electroluminescent material on the areas defined by a partition for partitioning the luminescent layers and then drying out the liquid droplet. In this case, the behavior of liquid droplet when the solvent is vaporized from the liquid droplet depends on the solvent and the organic electroluminescent material contained in the liquid droplet, and a drying condition, Therefore, in order to provide uniform brightness from the luminescent layer in each pixel and an entire panel, a manufacturing should be carefully processed so as not to damage the flatness of the luminescent layer obtained by drying out the liquid droplet. In consideration of this point, JP-A-2002-252083 proposes to coat the liquid droplet even on areas originally not functioning as a pixel area in order to prevent the liquid droplet from being dried out too fast.

In addition, JP-A-2002-148429 discloses a technique for improving wetness of the liquid droplet on the surfaces of the partitions to flatten the luminescent layer formed after the dry-out process by performing a surface roughening for the surfaces of the partitions that define the areas where the liquid droplet containing the organic electroluminescent material is coated, i.e., the area where the luminescent layer is to be formed.

In this kind of organic electroluminescent device, the luminescent portion formed by coating the organic electroluminescent material to further improve a numerical aperture is preferably not circular but noncircular in a plan view. More specifically, in order to further Improve the numerical aperture of the entire organic electroluminescent device, an arrangement where the luminescent portions having an anisotropic cylindrical form extending along a certain direction in a plan view are arranged in an array form is more efficient than an arrangement where the luminescent portions having a circular shape in a plan view are arranged in an array form.

However, when a liquid droplet is coated on the cylindrical form area surrounded by the partitions to provide the luminescent portions having an isotropic shape in a plan view, a force applied from the side wall surface of the partition to the coated liquid droplet is anisotropic, and a force applied from each side surface wall adjoining the liquid droplet to the liquid droplet when the liquid droplet is dried is irregular for each direction. Therefore, it is technically difficult to provide a flat luminescent layer.

In consideration with the aforementioned technical problems, it is difficult to provide a luminescent layer having a sufficiently uniform thickness based on the JP-A-10-153967and the JP-A-2002-252083. Even when the technique disclosed in JP-A-2002-148429 is used, it is difficult to flatten the surface of the liquid droplet by adjusting the force applied from the side wall surface that defines the anisotropic area on which the liquid droplet is coated to the liquid droplet in each direction just through a surface roughening on the side wall surface of the partition, and it is also difficult to provide a flat luminescent layer through the dry-out process. When the luminescent layer is formed on each of a plurality of pixels defined by the partitions on a large panel using an inkjet method, it is difficult to provide a flat luminescent layer by drying out the coated liquid droplet coated in each area due to inconsistent drying rate generated depending on locations between a portion near edges of the panel and a portion near the center of the panel.

SUMMARY

An advantage of the invention is that it provides an organic electroluminescent device having a flat luminescent layer formed by coating a coating solution containing an organic electroluminescent material on an anisotropic area such as a cylindrical form using an inkjet method and drying out the coating solution, and an optical device such as a color filter formed by coating a coating solution containing an optical material on an anisotropic area using an inkjet method in a similar way to the above organic electroluminescent device.

According to a first aspect of the invention, there is provided an organic electroluminescent device including: a panel; a partition that defines a plurality of hollows arranged in an anisotropic shape in a plan view on the panel; a luminescent portion formed by individually coating a coating solution containing an electroluminescent material on each of the plurality of hollows and drying out the coating solution coated on the hollows; and a drain means that is formed in the partition to drain part of the coating solution coated on the hollow so that a surface of the luminescent portion can be flattened.

In the organic electroluminescent device according to a first aspect of the invention, the partition defines, for example, a plurality of hollows that are individually formed on each pixel. More specifically, the partition electrically separates the luminescent layers formed by coating the coating solution containing the organic electroluminescent material on a plurality of hollows from each other. Each luminescent layer can independently emit light. For example, the luminescent layers are formed by coating the coating solution containing the organic electroluminescent materials capable of emitting red, green and blue colors on each of a plurality of the hollows so that a full color image can be displayed.

The luminescent layers are formed by coating the coating solution on each of the hollows using a coating method such as an inkjet method and drying out the coating solution coated on each hollow. Each of a plurality of hollows has an anisotropic shape in a plan view in order to increase a numerical aperture of the organic electroluminescent device. For example, the hollows having a cylindrical form defined by the partition in a plan view are arranged in an array form on the pixel area of the panel. As a result, the luminescent portion formed in each hollow according to a first aspect of the invention can increase the numerical aperture in comparison with the organic electroluminescent device formed by arranging the luminescent portions having an isotropic shape such as a circle in a plan view. Herein, in each pixel where the luminescent portion is provided, an area where the light can be emitted is called "an opened area", the remaining area other than the opened area is called "non-opened area". Also, the numerical aperture denotes a ratio of the opened area against the entire area of the pixels (including the opened area and the non-opened area).

In this case, a force applied from the side wall surface of the partition defining the hollows to the coating solution coated on the hollow becomes anisotropic due to an anisotropic shape of the hollow in a plan view when the coating solution is coated on the hollows or the coating solution coated on the hollows is dried. Therefore, the surface of the coating solution has an irregular height along each direction with respect to the center of the hollow due to this anisotropic force. When the coating solution coated on the hollow is dried without change in this state, it is difficult to provide a flat surface of the luminescent portion, and the thickness of the luminescent portion formed on one hollow becomes irregular in each part. In this situation, the driving current flowing through a luminescent portion changes in each part of the luminescent portion due to a difference of a thickness. As a result, different brightness is generated from each part of one luminescent portion.

In the organic electroluminescent device according to a first aspect of the invention, part of the coating solution is drained from the hollow through a drain means before the coating solution is dried. As a result, a force is applied from the partition to the coating solution to flatten the surface of the coating solution coated on the hollow. It is possible to flatten the surface of the luminescent portion finally formed by uniformly vaporizing the solvent included in the coating solution from the flattened surface of the coating solution.

In the organic electroluminescent device according to a first aspect of the invention, it is possible to flatten the surface of the luminescent portion and reduce a difference of brightness generated by a different thickness of the luminescent portion even when the coating solution containing the organic electroluminescent materials capable of emitting, for example, red, green and blue colors is coated on each hollow using an inkjet method. As a result, it is possible to reduce a difference of brightness generated due to a different thickness of the luminescent portion and display a high duality image having a reduced difference of brightness.

In an example of the organic electroluminescent device according to a first aspect of the invention, the drain means may be connected to the coating solution through a side wall surface of the partition.

In this example, the force is directly applied to the coating solution from the drain means connected from the side wall surface of the partition to the coating solution. More specifically, when the force is directly applied from the drain means to the coating solution, the force applied to the coating solution along each direction viewed from the center of the hollow is adjusted, so that the surface of the coating solution can be flattened in the hollow.

In an example of the organic electroluminescent device according to a first aspect of the invention, an area of a first side wall surface extending along a lateral direction of the hollow may be smaller than that of a second side wall surface extending along a longitudinal direction of the hollow, and the drain means may be connected from the first side wall surface to the coating solution.

In this example, when the hollow has, for example, a cylindrical form in a plan view, the first side wall surface extends along a lateral direction which is relatively shorter than a longitudinal direction. When the depth of the hollow is constant, the area of the first side wall surface is relatively smaller than the area of the second side wall surface extending in a longitudinal direction. The forces applied to the coating solution from the first and second side wall surfaces are different from each other along the longitudinal and lateral directions depending on the areas of the first and second side wall surfaces making contact with the coating solution. More specifically, the contact area where the coating solution makes contact with the first side wall surface is relatively smaller than the contact area where the coating solution makes contact with the second side wall surface. The force applied to the coating solution from the first side wall surface along a longitudinal direction is smaller than the force applied to the coating solution from the second side wall surface along a lateral direction.

Accordingly, in this example, the drain means connected to the first side wall surface directly drains part of the coating solution coated on the hollow from the first side wall surface to the outside of the hollow. Therefore, the forces applied to the coating solution from the first and second side wall surfaces are adjusted to flatten the surface of the coating solution. As a result, it is possible to provide a flat luminescent portion by drying out the coating solution coated on the hollow in this situation In this example, the drain means may be a tunnel extending in the partition along the longitudinal direction to open the first side wall surface, and the coating solution may be drained from the hollow through the tunnel.

In this case, the forces applied from the first and second side wall surfaces to the coating solution are adjusted by draining part of the coating solution from the first side wall surface through the tunnel, so that the surface of the coating solution becomes flattened. The tunnel extends in the partition along a longitudinal direction. Part of the coating solution is drained to the outside of the hollow through the tunnel by virtue of a capillary phenomenon. In this case, since part of the coating solution is drained, a force is applied to the coating solution remained in the hollow along a longitudinal direction. It is possible to prevent the surface of the coating solution coated on the hollow from being sunken near the first side wall surface. It is possible to relatively reduce a force applied from the second side wall surface to the coating solution by increasing a force applied from the first side wall surface. Accordingly, it is possible to flatten a portion protruded from the surface of the coating solution near the second side wall surface. The amount of the coating solution drained through the tunnel may be adjusted by setting the size of the tunnel, more specifically, the size of the opening connected from the first side surface to the hollow and the length of the tunnel extending along a longitudinal direction based on experiments, principles, and simulations after observation of a vaporization behavior of the coating solution and a composition of the coating solution.

In another example of the organic electroluminescent device according to a first aspect of the invention, the drain means may be a trench extending along the longitudinal direction to open the first side wall surface and the partition, and the coating solution may be drained from the hollow through the trench.

In this example, part of the coating solution is drained though the trench from the first side wall surface to apply the same coating force from the first and second side wall surfaces. The trench is formed in the partition and extends along a longitudinal direction. Part of the coating solution is drained from the hollow through the trench by virtue of a capillary phenomenon. As a result, it is possible to prevent the surface of the coating solution coated on the hollow from being sunken near the first side wall surface. In addition, it is possible to relatively reduce a force applied from the second side wall surface to the coating solution by increasing a force applied from the first side wall surface to the coating solution. Therefore, it is possible to flatten the surface of the coating solution protruded near the second side wall surface. The amount of the coating solution drained through the trench may be adjusted by setting the size of the trench, more specifically, the size of the opening connected from the first side surface to the hollow and the length of the trench extending along a longitudinal direction based on experiments, principles, and simulations after observation of a vaporization behavior of the coating solution and a composition of the coating solution.

According to a second aspect of the invention, there is provided an organic electroluminescent device including: a panel; a partition that is formed on the panel and defines a plurality of hollows having an isotropic shape in a plan view; a plurality of luminescent portions formed by individually coating a coating solution containing an organic electroluminescent material on each of a plurality of the hollows and drying out the coating solution coated on a plurality of the hollows; and a drain means that drains a different amount of the coating solution from each of a plurality of the hollows depending on a location defined for each of a plurality of the hollows on the panel to flatten each surface of a plurality of the luminescent portions.

In the organic electroluminescent device according to a second aspect of the invention, the partition defines, for example, each of a plurality of hollows Individually formed on each pixel. More specifically, the partition electrically separates the luminescent layers formed by coating the coating solution containing the organic electroluminescent material on a plurality of hollows from each other. Each luminescent layer can independently emit light. For example, the luminescent layers are formed by coating the coating solution containing the organic electroluminescent materials capable of emitting red, green and blue colors on each of a plurality of the hollows so that a full color image can be displayed.

The luminescent layers are formed by coating the coating solution on each of the hollows using a coat method such as an inkjet method and drying out the coating solution coated on each hollow. A plurality of the hollows have an anisotropic shape in a plan view in order to increase a numerical aperture of the organic electroluminescent device. For example, the hollows have a cylindrical form defined by the partition in a plan view so as to be arranged in an array form on the pixel area of the panel. Therefore, the luminescent portion formed in each hollow according to a second aspect of the invention can increase the numerical aperture in comparison with the organic electroluminescent device formed by arranging the luminescent portions having an isotropic shape such as a circle in a plan view.

In this case, a force applied from the side wall surface of the partition defining the hollows to the coating solution coated on the hollow becomes anisotropic due to an anisotropic shape of the hollow in a plan view. Therefore, the surface of the coating solution has an irregular height along each direction with respect to the center of the hollow due to this anisotropic force. In addition, a dry rate of the coating solution coated on a plurality of hollows is different depending on locations defined for each hollows on the panel. More specifically, the coating solution coated on the hollows near the edges of the panel is dried faster, and the coating solution coated on the hollows near the center of the panel is dried later. Particularly, with increasing demands on a large organic electroluminescent device, a difference of the dry rate of the coating solution depending on the locations of the hollows on a large panel becomes significant Due to the different dry rate, a difference of the flatness in the luminescent portion formed on each hollow is generated, so that a difference of brightness may be finally generated.

Accordingly, in the organic electroluminescent device according to a second aspect of the invention, a different amount of the coating solution is drained from each of a plurality of hollows depending on the locations defined for each of a plurality of hollows on a panel through the drain means to flatten the surface of each luminescent portion.

As a result, it is possible to flatten the surface of the coating solution coated on each hollow. Also, it is possible to flatten each luminescent portion by drying out such a coating solution, and reduce a difference of the thickness generated in each luminescent portion. More specifically, even in a large organic electroluminescent device formed using a large panel, it is possible to reduce a difference of brightness between the luminescent portion formed near the edges of the panel and the luminescent portion formed near the center of the panel, and display a high quality image.

In an example of the organic electroluminescent device according to a second aspect of the invention, the drain means may be a tunnel or a trench formed in the partition to have a different size depending on the location.

In this example, the coating solution can be drained from the hollow through the tunnel or the trench by virtue of a capillary phenomenon. The size of the tunnel or the trench may be set depending on the location of the hollow based on experiments, principles, or simulations. The amount of the coating solution drained from each hollow may be controlled by adjusting the size of the tunnel or the trench. Accordingly, the force applied from the partition to the coating solution can be adjusted to flatten the surface of the coating solution coated on the hollow.

According to a third aspect of the invention, there is provided an optical device including: a panel; a partition that is formed on the panel and defines a plurality of hollows having an anisotropic shape in a plan view; an optical layer formed by individually coating a coating solution containing an optical material on each of a plurality of the hollows and drying out the coating solution coated on the hollows; and a drain means that is formed in the partition and drains part of the coating solution coated on the hollows from the hollows to flatten a surface of the optical layer.

In the optical device according to a third aspect of the invention, It is possible to provide a flat optical layer similar to the organic electroluminescent device according to a first aspect of the invention. Accordingly, it is possible to prevent the optical characteristics from being degraded due to a difference of the thickness in the optical layer.

According to a fourth aspect of the invention, there is provided an optical device including: a panel; a partition that is formed on the panel and defines a plurality of hollows having an anisotropic shape in a plan view; a plurality of optical layers formed by individually coating a coating solution containing an optical material on each of a plurality of the hollows and drying out the coating solution coated on a plurality of the hollows; and a drain means that drains a different amount of the coating solution from each of a plurality of the hollows depending on a location defined for each of a plurality of the hollows on the panel to flatten each surface of a plurality of the optical layers.

In the optical device according to a third aspect of the invention, it is possible to provide a flat optical layer similar to the organic electroluminescent device according to a second aspect of the invention. Accordingly, it is possible to prevent a difference of the thickness between the optical layers, and obtain a uniform optical characteristic on the entire area of the optical device.

These functions and other advantages of the invention will be apparent by carefully understanding the following embodiments of the invention.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the invention will be an organic electroluminescent device and an optical device according to an embodiment of the invention will now be described with reference to the accompanying drawings.

First Embodiment

Figure 1:
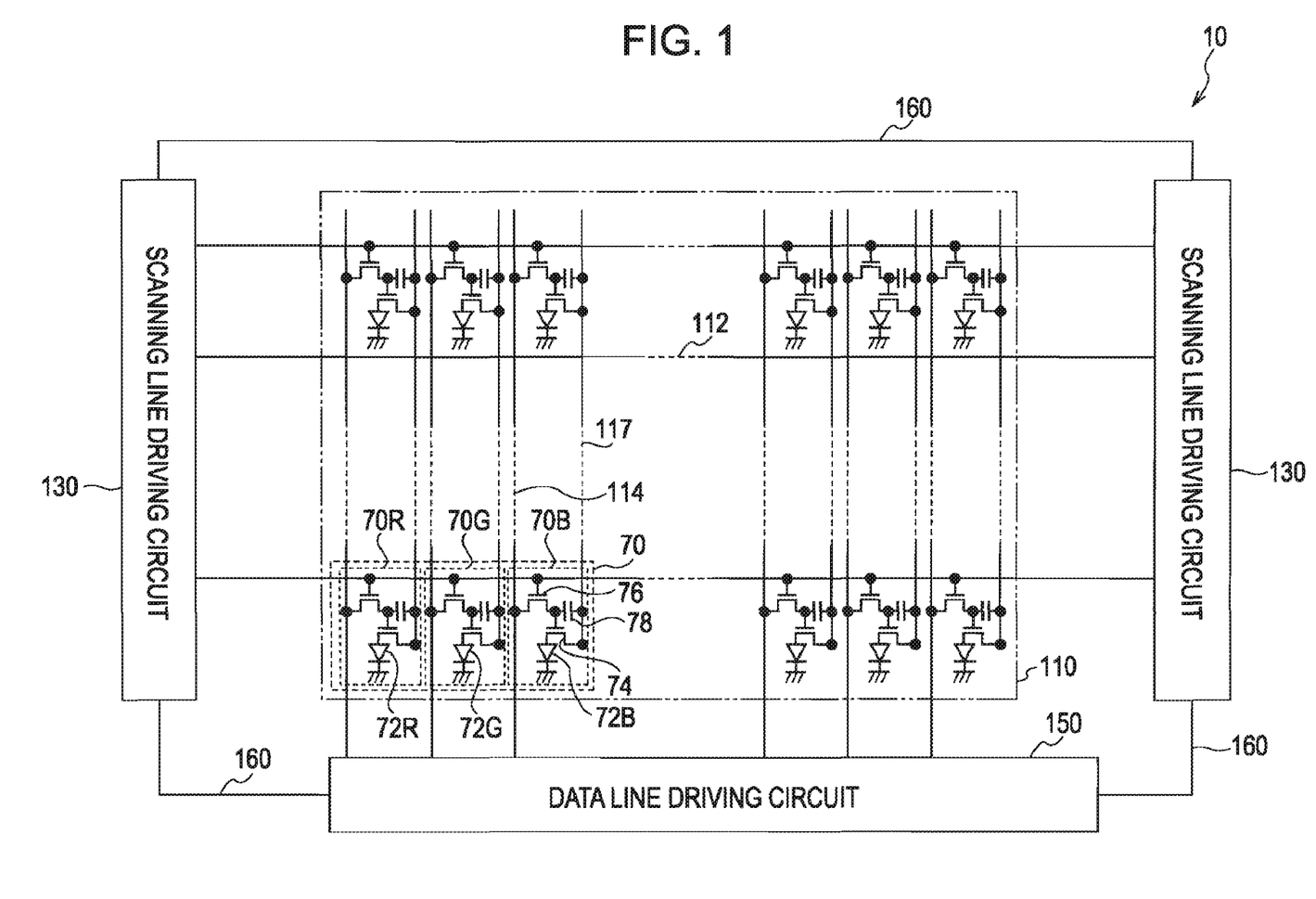
FIG. 1 is a block diagram illustrating an entire construction of an organic electroluminescent device 10 according to a first embodiment of the invention.

Firstly, an organic electroluminescent device according a first embodiment of the invention will be described with reference to FIGS. 1 to 7. FIG. 1 is a block diagram illustrating an entire construction of an organic electroluminescent device according to a first embodiment of the invention.

Referring to FIG. 1, the organic electroluminescent device 10 is an active matrix type display device having an embedded driving circuit, and each pixel 70 included in the organic electroluminescent device 10 includes an organic electroluminescent element 72.

Data lines and scanning lines extending across each other in vertical and horizontal directions are arranged in the pixel area 110 of the organic electroluminescent device 10. The subpixels 70R, 70G and 70B provided in each intersection are arranged in a matrix form, and a set of three subpixels constitutes one pixel 70. The subpixels 70R, 70G and 70B have organic electroluminescent elements 72R, 72G, and 72B emitting red, green and blue light, respectively. In the pixel area 110, data supply lines 117 are provided for each subpixel 70R, 70G and 70B corresponding to each data line 114.

A scanning line driving circuit 130 and a data line driving circuit 150 are provided in neighboring areas surrounding the pixel area 110. The scanning line driving circuit 130 supplies the scanning signals to a plurality of scanning lines 112 in a predetermine order. The data line driving circuit 150 supplies image signals to the data lines 114 provided in the pixel area 110. The scanning line driving circuit 130 and the data line driving circuit 150 operate in synchronization with each other through a synchronization signal line 160. A power voltage for driving the pixel is supplied from an external circuit to the power supply line 117. Taking attention to one pixel 70 in FIG. 1, the organic electroluminescent elements 72R, 72G and 72B are provided in the pixel 70, as well as a switching transistor 76 and a driving transistor 74 constructed of a thin film transistor (TFT), and a retaining capacitor 78 are provided in each subpixel. The scanning line 112 is electrically connected to the gate electrode of the switching transistor 76, the data line 114 is electrically connected to the source electrode of the switching transistor 76, and the gate electrode of the driving transistor 74 is electrically connected to the drain electrode of the switching transistor 76. The power supply line 117 is electrically connected to the drain electrode of the driving transistor 74, and the positive electrode of the organic electroluminescent element 72 is electrically connected to the source electrode of the driving transistor 74. Although an exemplary circuit construction of a pixel is shown in FIG. 1, other circuit constructions such as a voltage programmed type pixel circuit, a current programmed type pixel circuit, a voltage comparator type pixel circuit, and a sub-frame type pixel circuit can be adopted.

Figure 2:
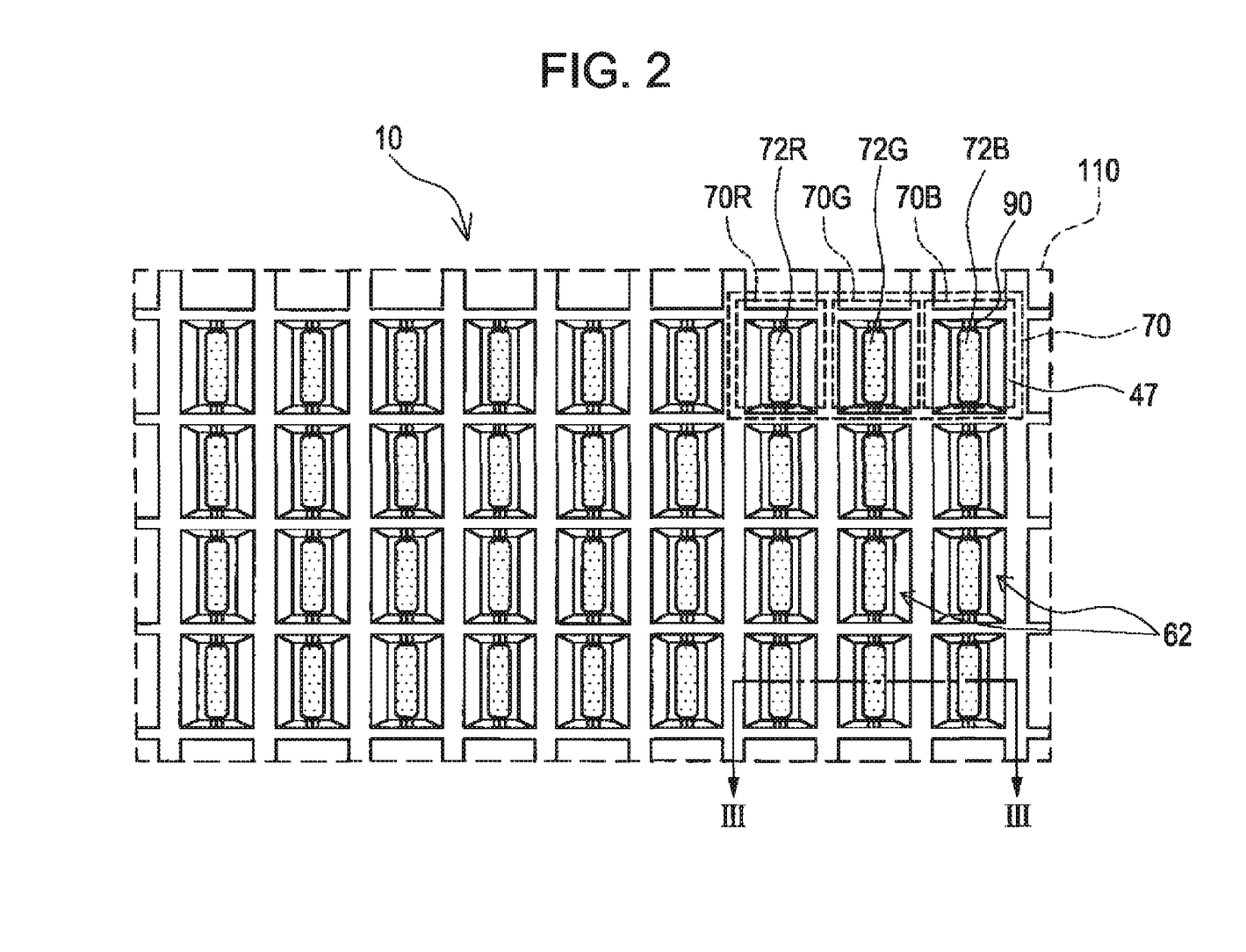
FIG. 2 is a plan view schematically illustrating an organic electroluminescent device 10 according to a first embodiment of the invention.
Figure 3:
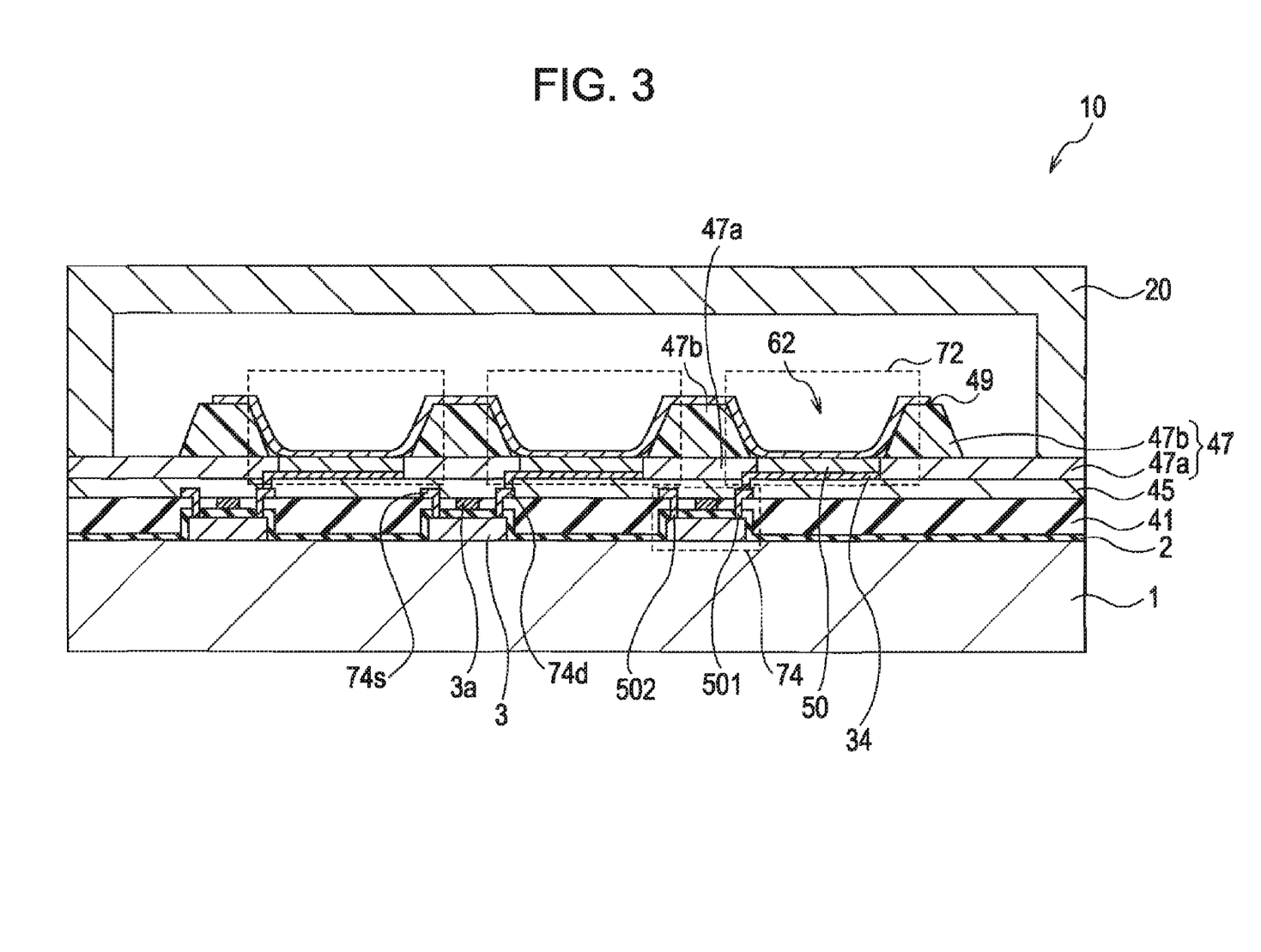
FIG. 3 is a cross-sectional view along a line III-III' of FIG. 2.

Subsequently, an entire construction of an organic electroluminescent device 10 will be described with reference to FIGS. 2 and 3. FIG. 2 is a plan view schematically illustrating a construction of an organic electroluminescent device 10, and FIG. 3 is a cross-sectional view along a line III-III' of FIG. 2.

Referring to FIG. 2, the organic electroluminescent device 10 includes a panel 10, pixels 70, banks 47 functioning as a partition according to the invention, a tunnel 90 functioning as a draining means according to the invention, and an organic electroluminescent element 72.

A plurality of pixels 70 are arranged in a pixel region 110 on the panel 1 in a matrix form. A pixel 70 includes a group of three subpixels 70R, 70G and 70B arranged in a horizontal direction, and a plurality of the pixels 70 are arranged in a matrix form extending in each of the vertical and horizontal directions.

A plurality of banks 47 are extended in a widespread area of the entire pixel region 110 of the panel 1, and each of the banks 47 defines a hollow 62 where the organic electroluminescent element 72 is formed in each pixel. The organic electroluminescent elements 72R, 72G and 72B formed in the subpixels 70R, 70G and 70B, respectively, extend to the front side in a plan view, i.e., an upper side of the panel 1 from the bottom of the hollow 62. The tunnel 90 is provided in the bank 47, and its opening is connected to the hollow 62. The hollow 62 where the organic electroluminescent layer 50 is provided has a long cylindrical form in a plan view in order to increase the numeral aperture of the pixel area 110 using the organic electroluminescent layer 50 finally formed on the bottom of the concave portion 62. The organic electroluminescent layer included in the organic electroluminescent element 72 extends to the panel 1 from the bottom of the concave portion 62 through a negative electrode (not shotgun in the drawings). The construction and the function of the tunnel 90 will be described below in detail.

Referring to FIG. 3, the organic electroluminescent device 10 includes a panel 1, an organic electroluminescent element 72 formed on the panel 1, a driving transistor 74, a bank 47, and an encapsulation 20. Although FIG. 3 illustrates a bottom emission type organic electroluminescent element 72 that emits light to the lower side in the drawing, a luminescent device according to the invention can be applied to a top emission type organic electroluminescent device that emits light to an upper side in the drawing. The lower side of the bank 47 is a non-opened area that does not emit light from the organic electroluminescent layer 50, and the lower side of the organic electroluminescent layer 50 is an opened area.

The panel 1 formed of, for example, glass transmits the light emitted from the organic electroluminescent element 72 to the lower side of the drawing. Accordingly, the driving transistor 74 and the switching transistor 76 shown in FIG. 1 are formed such that they are not overlapped with the lower area of the organic electroluminescent element 72 when viewed from the panel 1. On the panel 1; various circuits including the scanning line driving circuit 130 and the data line driving circuit 150 shown in FIG. 1 as well as the organic electroluminescent element 72 are provided. These circuits are formed in neighboring areas surrounding the pixel area 110 on the panel 1.

The organic electroluminescent element 72 includes positive and negative electrodes 34 and an organic electroluminescent layer 50 functioning as a luminescent portion according to the invention.

Each organic electroluminescent layer 50 has a plurality of organic layers including the luminescent layer as described below. These organic layers are formed by individually coating a coating solution containing an organic electroluminescent material on the hollow 62 surrounded by the bank 47 which functions as an organic partitioning portion for separating a plurality of organic electroluminescent layers 50. More specifically, the organic electroluminescent layer 50 is formed by individually coating an ink for forming each organic electroluminescent layer 50 on the hollow 62 using an inkjet method as a coating method and then drying out -he coating solution coated on the hollow 62 in a predetermined drying condition. The organic electroluminescent layer 50 has a flat surface. Therefore, a driving current can uniformly flow through each organic electroluminescent layer 50 when they are driven so that they can emit light with uniform brightness. Although the organic electroluminescent element 72 according to an embodiment of the invention has a three-layer structure including a positive electrode 34, an organic electroluminescent layer 50, and a negative electrode 49, a hole-injection/transport layer may be inserted between the positive electrode 343 and the organic electroluminescent layer 50, or an electron-injection/transport layer may be inserted between the negative electrode 49 and the organic electroluminescent layer 50.

The bank 47 includes a first bank portion 47a and a second bank portion 47b and defines a hollow 62 formed on the organic electroluminescent layer 50. The first bank portion 47a is an inorganic layer formed of an inorganic material such as SiO, $SiO_2$ or $TiO_2$, and formed on the protection layer 45 using a film deposition method such as a chemical vapor deposition (CVD), a coating method, and a sputter method. The second bank 47b is an organic layer formed of an organic material such as acrylic resin or polyimide resin and formed in a tapered shape which becomes gradually thinner as elevated to an upper direction. The second bank portion 47b is formed by depositing an organic layer on the first bank portion 47a and patterning the organic layer using a photolithographic technique. The second bank portion 47b is formed such that its bottom is reduced in comparison with the first bank 47a along a longitudinal direction in the drawing.

The negative electrode 49 is formed such that the surfaces of the second bank 47b and the organic electroluminescent layer 50 are covered. The negative electrode 49 is a common electrode connected in common through the organic electroluminescent elements 72 formed on the panel 1. The negative electrode 49 is an electrode physically connected among a plurality of organic electroluminescent devices 72 or a single sheet of electrodes in a plan view on the panel 1. The negative electrode 49 is formed of a material selected from a group consisting of Al, Cu, Ag, and Au, and formed by depositing the material on each surface of the organic electroluminescent layer 50 and the bank 47 using a physical thin-film deposition method such as a vacuum deposition method.

The positive electrode 34 is buried to the first bank portion 47a among a gate insulation layer 2, an interlayer insulation film 41, a protection layer 45, and the first bank portion 47a formed on the panel 1. The positive electrode 34 is a transparent electrode formed on a transparent material such as indium tin oxide (ITO) in order to transmit the light emitted from the organic electroluminescent layer 50 to the lower side in the drawing.

The source electrode 74s of the driving transistor 74 is electrically connected to the power supply line 117 shown in FIG. 1, and the drain electrode 74d is electrically connected to the positive electrode 34. The driving transistor 74 is turned on/off based on the data signal supplied to the gate electrode 3a through the data line 114 of FIG. 1 so that the driving current can be supplied to the organic electroluminescent element 72. A circuit including the above elements is not overlapped with the lower side of the organic electroluminescent element 50 so that the light emitted from the organic electroluminescent element 50 to the panel 1 is not interrupted. In addition, the switching transistor 76 is also formed on the panel 1 in a similar way to the driving transistor 74.

The transistor layer 3 is a silicon layer formed of a crystal silicon layer or an amorphous silicon layer using, for example, a low-temperature poly-silicon technique. The gate insulation layer 2 for the driving transistor 74 and the switching transistor 76 is formed on the semiconductor layer 3 by burying the semiconductor layer 3. The gate electrode 3a of the driving transistor 74 and the scanning line 112 of FIG. 1 are formed on the gate insulation layer 2. Part of the scanning lines 112 are formed as a gate electrode of the switching transistor 76.

The Interlayer insulation film 41 shown in FIG. 3 is formed on the gate insulation layer 2 by burying the gate electrode 3a of the driving transistor 74 or the scanning line 112. The interlayer insulation film 41 and the gate insulation layer 2 are formed of, for example, a silicon oxidation film. The source electrode 74s of the driving transistor 74, the power supply line 117, and the data line 114 formed of a conductive material such as aluminum or indium tin oxide (ITO) are provided on the Interlayer insulation film 41. Contact holes 501 and 502 extending from the surface of the Interlayer insulation film 41 through the interlayer insulation film 41 and the gate insulation layer 2 to the semiconductor layer 3 of the driving semiconductor 74 are provided on the Interlayer insulation film 41. A conductive film used in the power supply line 117 and the drain electrode 74d is successively extended along the inner walls of the contact holes 501 and 502 to the surface of the semiconductor layer 3. The power supply line 117 and the drain electrode 74d are buried on the interlayer insulation film 41, and, for example, a silicon nitride film SiNx or a silicon oxidation film SiOx is formed as a protection layer. The first bank portion 47a formed of, for example, a silicon oxidation film, is provided on the protection layer 45, and the second bank portion 47b is formed on the first bank portion 47a. The first and second bank portions 47a and 47b define an area for forming the organic electroluminescent layer in the pixel.

The encapsulation 20 prevents moisture from being penetrated to the organic electroluminescent layer 50 from outside. More specifically, the encapsulation 20 is bonded using an adhesive with the panel 1, and encapsulated such that the external air to the organic electroluminescent device 10 cannot be reacted with the organic electroluminescent element 72. An adhesive for bonding the encapsulation 20 with the panel 1 may include thermoplastic resin or UV-curable resin. For example, epoxy resin may be coated on the edge portions of the encapsulation 20 using a dispenser or the like.

Subsequently, a detailed construction of a tunnel 90 included in the organic electroluminescent device 10 and why the inventors perceive the tunnel according to the invention will be described with reference to FIGS. 4 to 7.

Figure 4A:
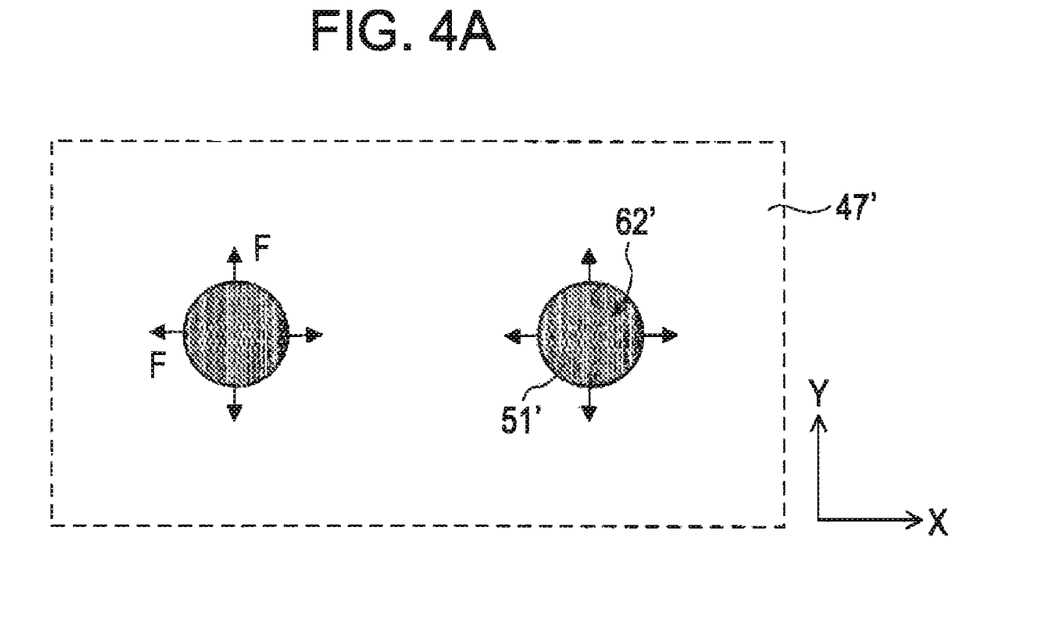
FIG. 4A and FIG. 4B are plan views for comparing a shape of an organic electroluminescent layer 50 extending from the bottom of a hollow 62.
Figure 4B:
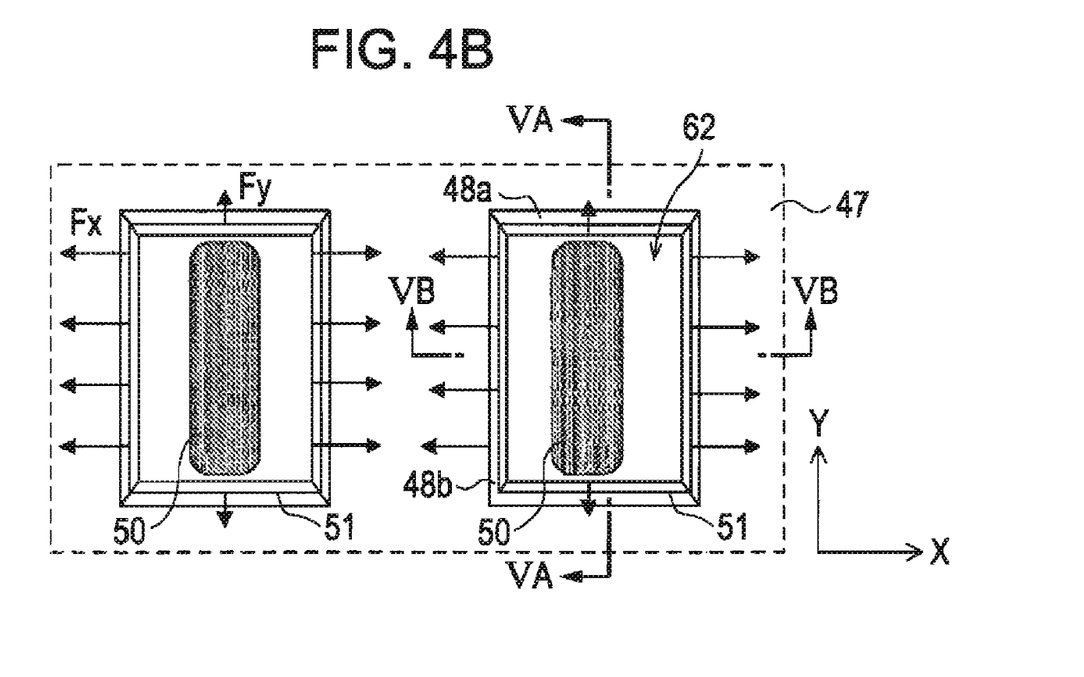
Figure 5A:
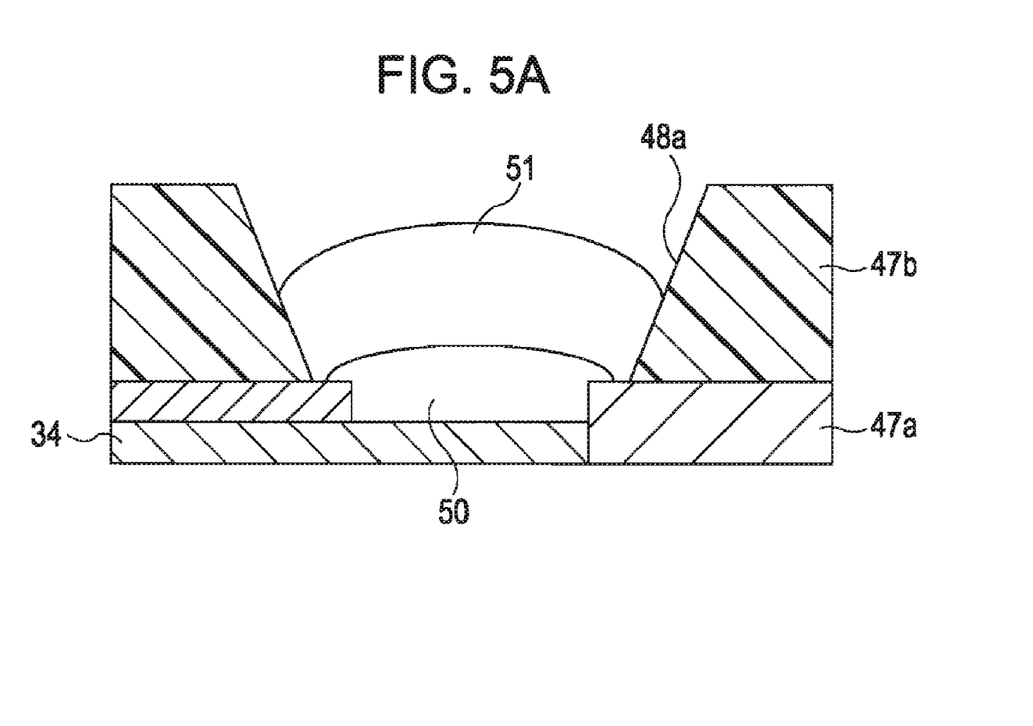
FIG. 5A and FIG. 5B are cross-sectional views along a line VA-VA' and a ling VB-VB' of FIG. 4B, respectively.
Figure 5B:
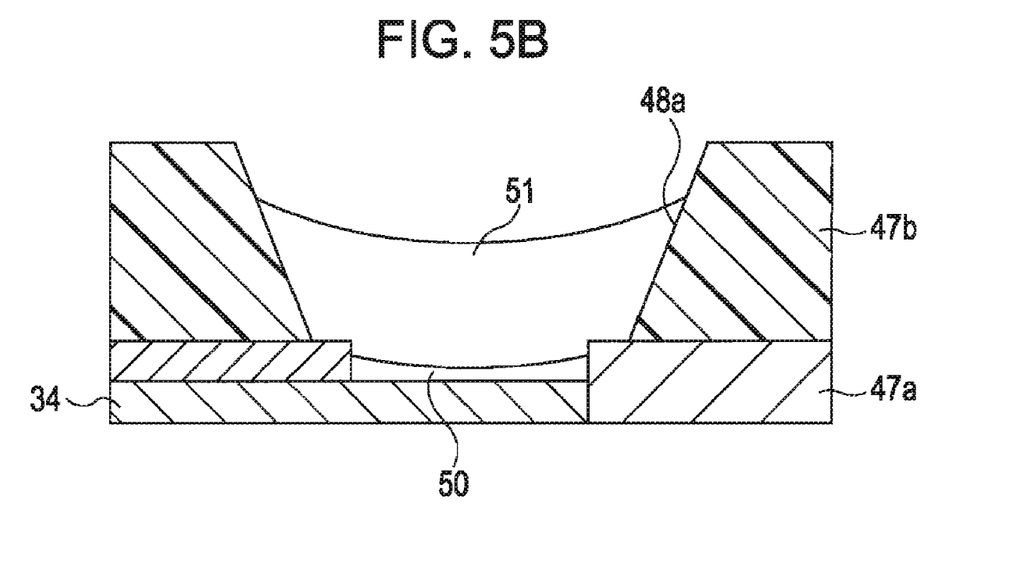

FIGS. 4A and 4B are plan views for comparing the plane shape of the organic electroluminescent layer 50 extending from the bottom of the hollow 62. Specifically, FIG. 4A is a plan view illustrating a construction of a known, organic electroluminescent layer 50, and FIG. 4B is a plan view illustrating a plane shape of an organic electroluminescent layer 50 included in the organic electroluminescent device 1 according to an embodiment of the invention. FIGS. 5A and 5B are cross-sectional views along VA-VA' and VB-VB' lines of FIG. 4B, respectively. In FIG. 4A, the bank 47' defines the hollow 62' where the coating solution containing an organic electroluminescent material is coated. The plane shape of the hollow 62' is circular. Therefore, when the coating solution containing the organic electroluminescent material is coated on the hollow 62', the coating solution 51' is added to the hollow 62' from the side wall surface of the bank 47' such that the coating solution 51' is extracted by the same force F in each of X and Y directions. In other words, a force F is applied from the side wall surface of the bank 47' to the coating solution 51' coated on the hollow 62' in an isotropic shape in a plan view. As a result, when the hollow 62' is circular, the surface of the coating solution coated on the hollow 62' is uniformly flattened in each direction so as to finally flatten the organic electroluminescent layer formed by drying out the coating solution.

On the other hand, when the hollow 62 has a cylindrical form having a length along the Y direction in a plan view as shown in FIG. 4B, a force Fy applied from a first side wall surface 48a extending along the X direction to the coating solution 51 is different from a force Fx applied from a second side wall surface 48b extending in the Y direction to the coating solution among the side wall surfaces defining the hollow 62 in the bank 47. More specifically, since the area where the coating solution 51 makes contact with the first side wall surface 48a is relatively smaller than the area where the second side wall surface 48b makes contact with the coating solution 51, the forces Fx and Fy applied to the coating solution are different from each other. Due to the different, forces Fx and Fy, the surface of the coating solution 51 is sunken near the first side wall surface 48a of the hollow 62 along the Y direction, and the center of the coating solution 51 is protruded near the first side wall surface 48a as shown in FIG. 5A. As shown in FIG. 5B, the center of the surface of the coating solution 51 is sunken in comparison with the side portion near the first side wall surface 48a. Therefore, as shown in FIGS. 5A and 5b, it is difficult to flatten the surface of the organic electroluminescent layer 50 formed on the bottom of the hollow 62 by drying out the coating solution.

Figure 6:
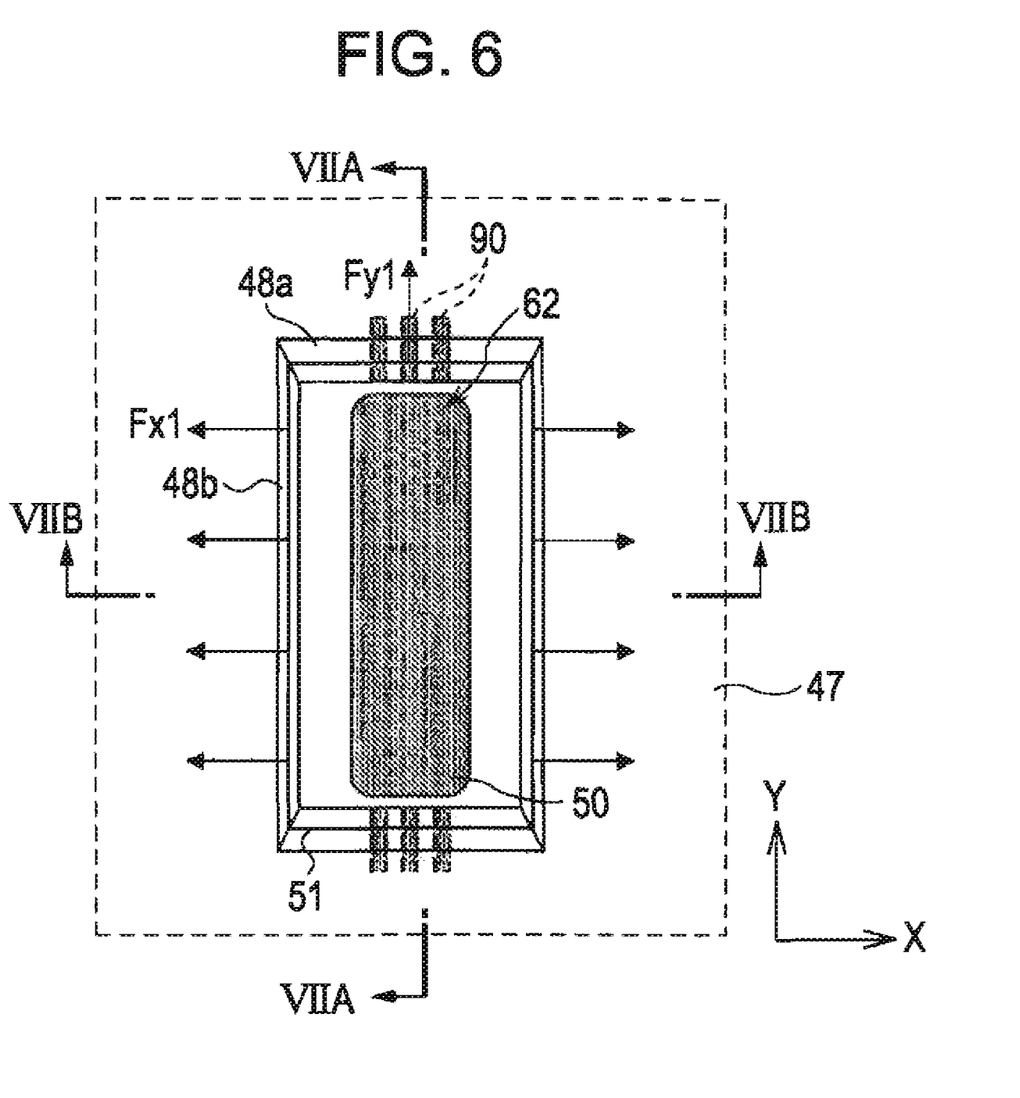
FIG. 6 is an enlarged plan view illustrating a pixel 70 of an organic electroluminescent device 10 according to a first embodiment of the invention.

Taking attention to the fact that the flatness of the surface of the coating solution 51 coated on the hollow 62 having an isotropic shape in a plan view is damaged by the force applied to the plane shape of the hollow 62, the inventors proposed to form the tunnel 90 in the organic electroluminescent device 10 as shown in FIG. 6. FIG. 6 is an enlarged plan view illustrating a pixel 70 of the organic electroluminescent device 10. The cross-sectional shapes of the coating solution shown in FIGS. 5A and 5B are just exemplary. Since the cross-sectional shape of the coating solution in the hollow 62 may be different depending on the coating solution and the organic electroluminescent material contained in the coating solution, the cross-sectional shape along the line VA-VA' may be changed with the cross-sectional shape along the line VB-VB'. Even in this case, it is possible to flatten the surface of the coating solution coated on the hollow by optimizing the shape of the hollow 60 as described below.

Referring to FIG. 6, the tunnel 90 is opened from the first side wall surface 48a to the coating solution 51, and extends to the inside of the bank 47 along the Y direction. After the coating solution 51 is coated on the hollow 62, part of the coating solution 51 is drained from the hollow 62 through the tunnel 90. The coating solution 51 is drained from the tunnel connected to the inside of the bank 47 to the outside of the hollow by virtue of a capillary phenomenon before it is dried out. In this case, a force Fy1 is applied to part of the coating solution 51 remained in the hollow 62 along the Y direction, so that surface of the coating solution 51 is flattened along the Y direction. At the same time, a force Fx1 is applied to flatten the surface of the coating solution 51 along the X direction. The forces applied from each of the first and second side wall surfaces 48a and 48b to the coating solution 51 are adjusted so that the force applied to the coating solution 51 from the first side wall surface 48b is relatively smaller than the other. As a result, the surface of the coating solution 51 is flattened along both x and y directions. The amount of the coating solution drained through the tunnel 90 may be individually and specifically adjusted by setting the size of the tunnel 90 including the size of the opening connected from the first side surface 48a to the hollow 62 and the length of the tunnel 90 extending along the Y direction based on experiments, principles, and simulations after observation of a vaporization behavior of the coating solution and a composition of the coating solution.

Figure 7A:
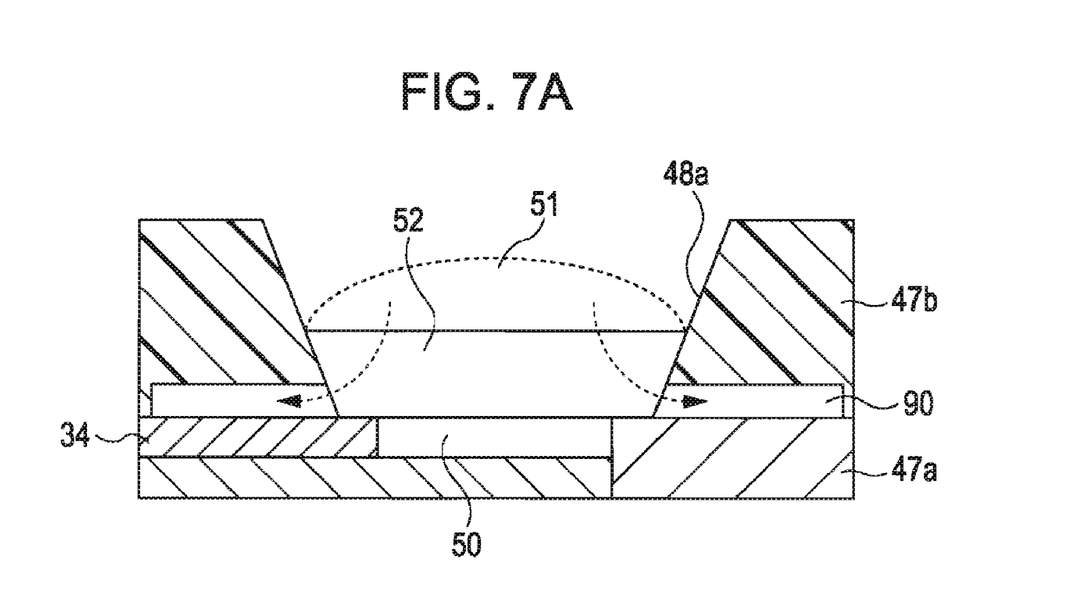
FIGS. 7A and 7B are cross-sectional views along a line VIIA-VIIA' and a line VIIB-VIIB' of FIG. 6, respectively.
Figure 7B:
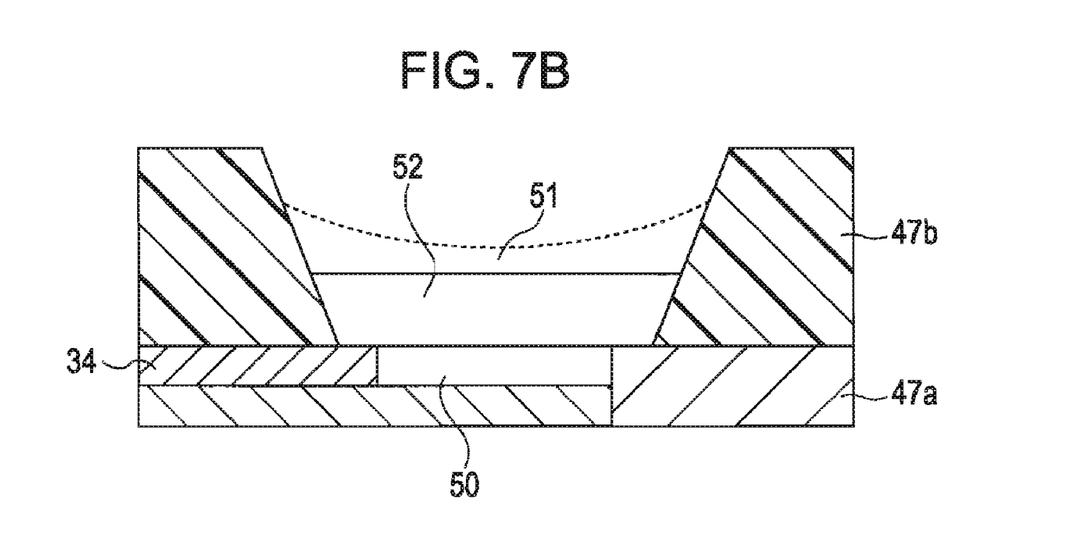

Referring to FIGS. 7A and 7B, the organic electroluminescent layer 50 having a flat surface is formed on the bottom of the hollow 62 having an anisotropic cylindrical form in a plan view by drying out the coating solution 52 obtained by flattening the surface of the coating solution 51 along the X and Y directions.

In the aforementioned organic electroluminescent layer 50, it is possible to flatten the surface of the organic electroluminescent layer 50 even when the coating solution containing organic electroluminescent material capable of emitting light of red, green, and blue colors is coated on each hollow 62 using an inkjet method. Also, it is possible to reduce the difference of brightness generated by different film thicknesses in the organic electroluminescent layer 50, and it is possible to display high quality image having little difference of brightness.

Variations

Figure 8:
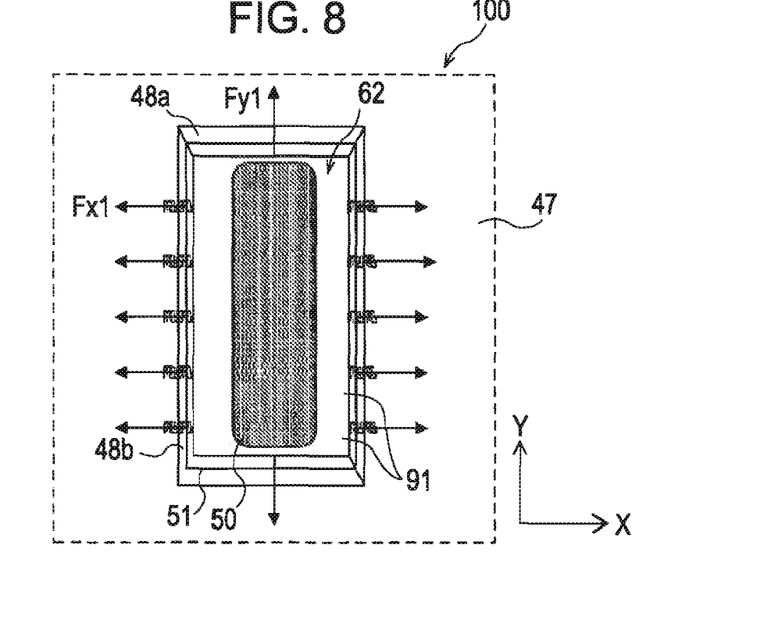
FIG. 8 is a plan view illustrating a variation of an organic electroluminescent device according to a first embodiment of the invention.
Figure 9:
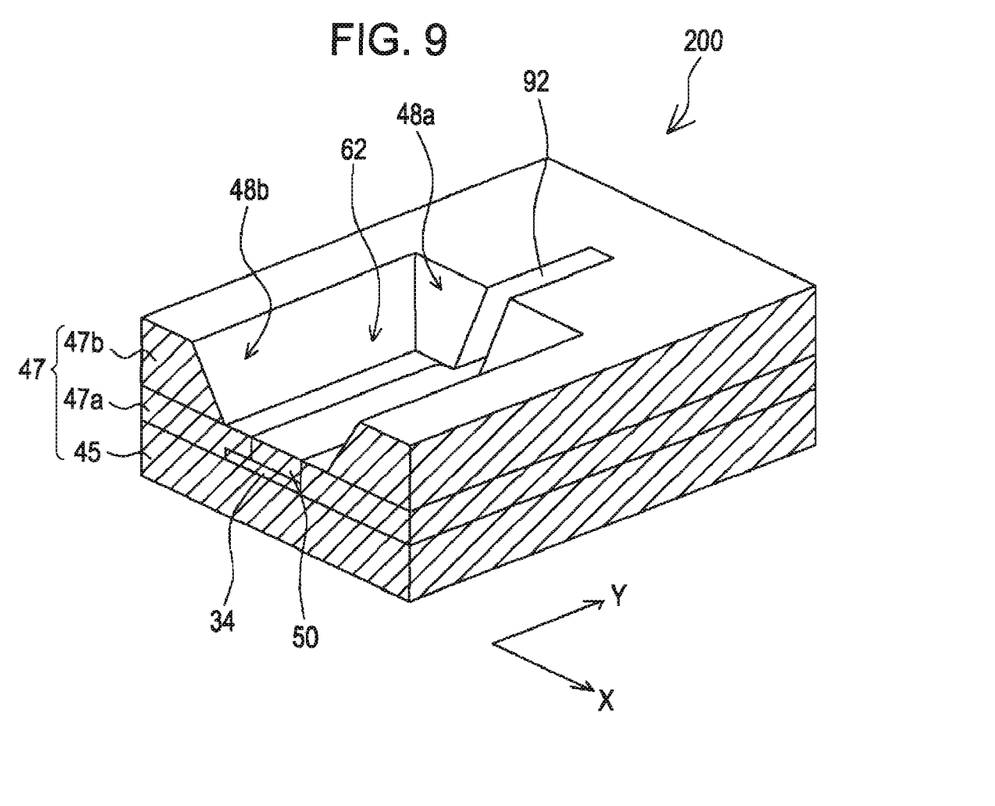
FIG. 9 is a partially cutaway perspective view illustrating another variation of an organic electroluminescent device according to a second embodiment of the invention.

Subsequently, variations of the organic electroluminescent device according to an embodiment of the invention will be described with reference to FIGS. 8 and 9. FIG. 8 is a plan view illustrating a variation of the organic electroluminescent device according to an embodiment of the invention. FIG. 9 is a partially cutaway perspective view illustrating another variation of the organic electroluminescent device according to an embodiment of the invention. Hereinafter, like reference numerals denote like elements for the parts common to the aforementioned organic electroluminescent device, and their detailed descriptions are omitted throughout variations and the second embodiment.

Referring to FIG. 8, the organic electroluminescent device 100 according to a variation of the invention has tunnels 91 opened on the second side wall surfaces 48b extending a longitudinal direction of the hollow 62 having a cylindrical form in a plan view. Since the surface flatness of the coating solution coated on the hollow 62 is different depending on the characteristics of the solvent and the organic electroluminescent material contained in the coating solution, the tunnels 91 opened on the second side wall surface 48b extending along the longitudinal direction of the hollow 62 may more appropriately flatten the surface of the coating solution in comparison with the tunnels on through the first side wall surface 48b. Therefore, the invention is not limited to the tunnels 90 opened on the first side wall surface 48a, but the tunnels 91 may be opened on the second side wall surface 48b as this variation of the organic electroluminescent device 100 to flatten the surface of the coating solution 51. As a result, it is possible to provide an organic electroluminescent layer 50 having a flat surface through a dry-out process.

Referring to FIG. 9, the organic electroluminescent device 200 according to another variation of the invention has a trench 92 for draining part of the coating solution form the hollow 62. The trench 92 extends along the Y direction corresponding to the longitudinal direction of the hollow 62, and is opened from the first side wall surface 48a to the hollow 62. The trench 92 allows part of the coating solution coated on the hollow 62 to be drained from the hollow 62 through the trench 92 by virtue of a capillary phenomenon to flatten the surface of the coating solution. As a result, it is possible to provide an organic electroluminescent layer 50 having a flat surface extending from the bottom of the hollow to an upper side by drying out the coating solution having the flat surface. The amount of the coating solution drained through the trench 92 may be individually and specifically adjusted by setting the size of the trench 92 including the size of the opening connected from the first side surface 48a to the hollow 62 and the length of the trench 92 extending along the Y direction based on experiments, principles, and simulations after observation of a vaporization behavior of the coating solution and a composition of the coating solution. Since the driving transistor 74 shown in FIG. 3 is not overlapped with the organic electroluminescent layer 50 in the interlayer insulation film 41 formed under the protection layer 45, it is not shown in FIG. 9.

Second Embodiment

Figure 10:
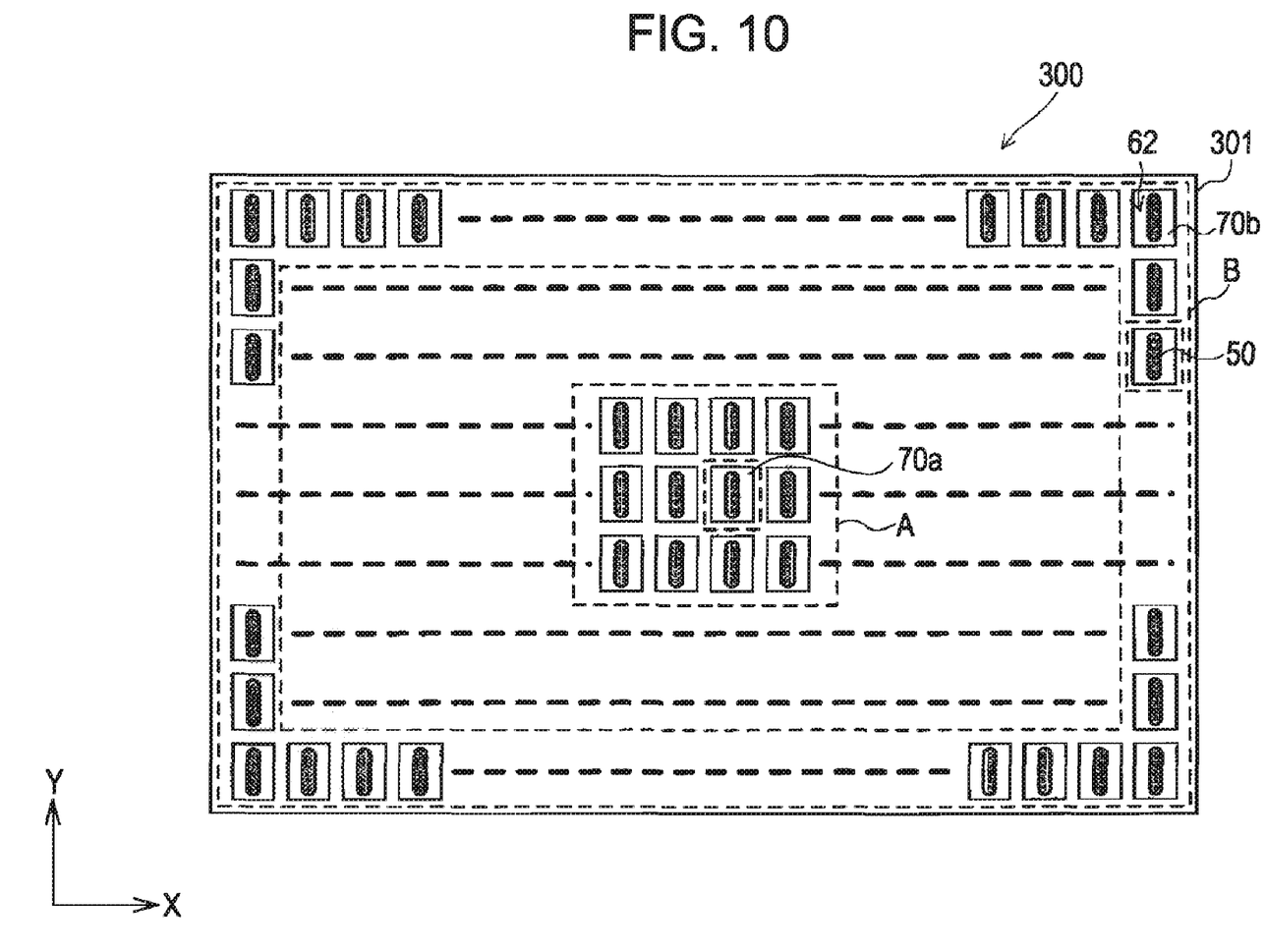
FIG. 10 is a plan view illustrating an organic electroluminescent device 300 according to a second embodiment of the invention.

An organic electroluminescent device according to a second embodiment of the invention will now be described with reference to FIGS. 10 and 11. FIG. 10 is a plan view illustrating an organic electroluminescent device 300 according to a second embodiment of the invention.

Referring to FIG. 10, an organic electroluminescent device 300 includes a plurality of pixels 70 having an organic electroluminescent layer 50 formed using an inkjet method. The dry rate of the coating solution coated on the hollow 62 defined by the bank 47 is different between a group of pixels 70b arranged near the edges of the panels 301 and a group of pixels 70a arranged near the center of the panel 301 among a plurality of pixels 70 included in a pixel area. More specifically, even when a drying condition is accurately controlled as the size of the panel 301 becomes large, the dry rate of the coating solution of a group of the pixels 70b is relatively faster than that of a group of the pixels 70a. Therefore, It is difficult to provide a uniform dry rate on the entire area of the panel 301.

Figure 11A:
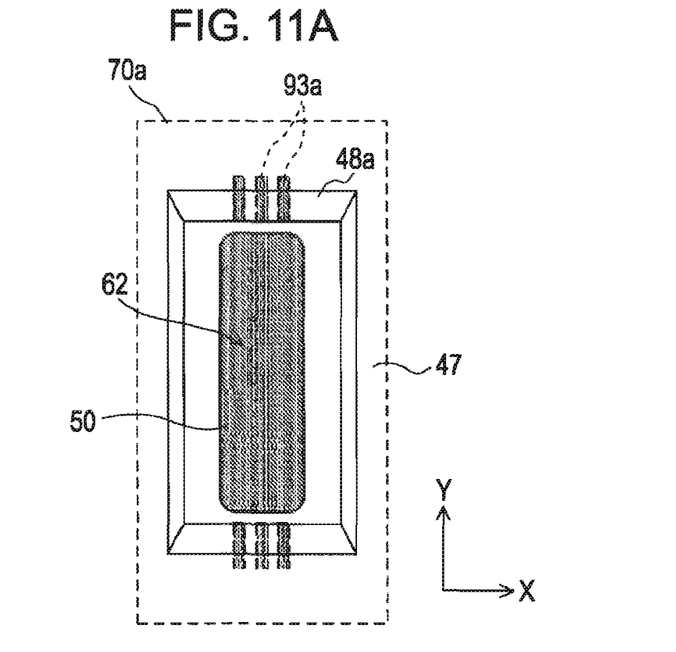
FIG. 11A and FIG. 11B are enlarged plan views illustrating pixels 70a and 70b of FIG. 10.
Figure 11B:
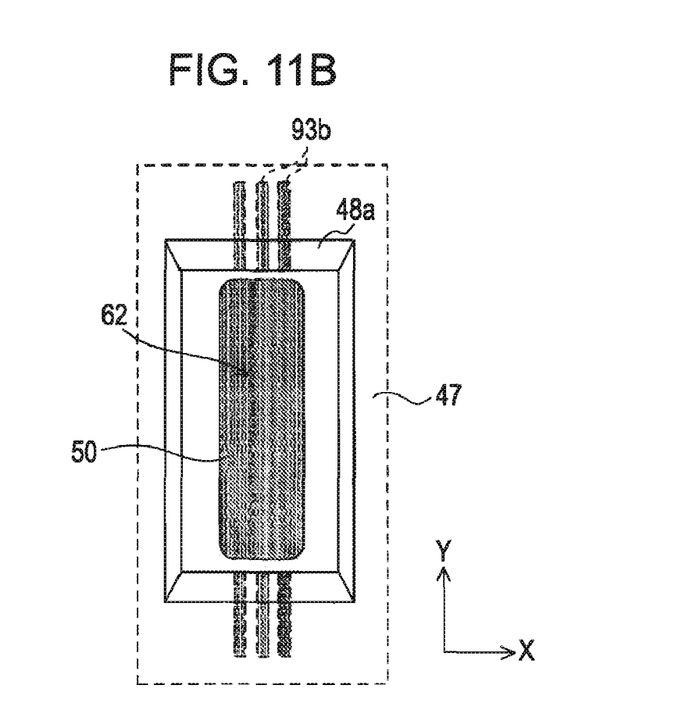

For this reason, as shown in FIGS. 11A and 11B, the organic electroluminescent device 300 includes tunnels 93a and 93b for draining a different amount of the coating solution from the hollow 62 depending on the locations of a group of pixels 70b arranged near the edges of the panel 301 and a group of pixels 70b arranged near the center of the panel 301 before the coating solution is dried out.

FIGS. 11A and 11B are enlarged plan views illustrating two groups of pixels 70a and 70b of FIG. 10, respectively.

Referring to FIG. 11A, the pixel 70a has tunnels 93a formed in the bank 47 to open the first side wall surface 48a of the hollow 62. Referring to FIG. 11B, the pixel 70b has tunnels 93b formed in the bank 47 to open the first side wall surface 48a of the hollow 62. As shown in FIGS. 11A and 11B, each of the tunnels 93a and 93b extends from the first side wall surface 48a to the inside of the bank 47 along the Y direction, i.e., along the longitudinal direction of the hollow 62 having a cylindrical form in a plan view. However, the lengths of the tunnels 93a and 93b are different from each other. More specifically, the length of the tunnel 93b is larger than that of the tunnel 93a. Therefore, the amount of the coating solution drained from the hollow 62 through the tunnel 93b of the pixel 70b before the dry-out process is relatively larger than the amount of the coating solution drained through the tunnel 93a of the pixel 70a. The amount of the coating solution drained from each pixel 70a and 70b is determined by different locations of the pixels 70a and 70b on the panel 301, i.e., the dry rate of the coating solution coated on the hollow 62. By changing the amount of the coating solution drained from the hollow 62 depending on the location of the pixel 70, it is possible to reduce an irregular surface of the organic electroluminescent layer 50 generated due to the different behavior of the coating solution during the dry-out process, e.g., a different dry rate of the coating solution on the panel. As a result, it is possible to provide an organic electroluminescent layer 50 having a flat surface on each pixel 70 even when the coating solution is individually coated on each hollow 62 using a coat method such as an inkjet method. Although the size of the tunnel provided in the pixel 70a is set to be smaller than that of the pixel 70b in this embodiment, the size of the tunnel formed in each pixel 70 may be individually and specifically optimized based on the size of the panel 301, the drying condition of the coating solution, characteristics of the solvent and the organic electroluminescent material contained in the coating solution for forming the organic electroluminescent layer 50. The size of the tunnel maybe sequentially enlarged from the center of the panel 301 to the edges thereof to form the tunnel in the bank 47 extending to each pixel. In addition, a trench may be formed instead of the tunnel in the partition, and a different amount of coating solution may be drained from the hollow through the trench.

As described above, in the organic electroluminescent device according to a first embodiment of the invention, it is possible to increase a numerical aperture and flatten the surface of the organic electroluminescent layer even when the coating solution containing organic electroluminescent materials emitting red, green, and blue colors is coated on each hollow using an inkjet method. Therefore, it is possible to reduce a difference of brightness generated due to a different thickness in the organic electroluminescent layer and display a high quality image having little irregularity of brightness. In the organic electroluminescent device according to a second embodiment of the invention, it is possible to reduce a difference of brightness generated between the organic electroluminescent layer formed near the edges of the panel and the organic electroluminescent layer formed near the center of the panel even in a large organic electroluminescent device on a large panel. Therefore, it is possible to display a high quality image.

The constructions of the organic electroluminescent device according to first and second embodiments of the invention may be applied to a color filter including an optical layer for transmitting each of red, green, and blue colors on the area defined by the bank. In this color filter, it is possible to flatten the surface of the coating solution using the tunnel or the trench formed on the bank after the coating solution is coated using a coat method such as an inkjet method. Then, it is possible to provide an optical layer having a flat surface by drying out the coating solution. Therefore, it is possible to provide a color filter having a superior optical characteristic in each optical layer.

Electronic Device

Subsequently, various electronic devices having the aforementioned organic electroluminescent device will be described with reference to FIGS. 12 and 13.

A: Mobile Computer

A mobile computer as an application of the aforementioned organic electroluminescent device will be described with reference to FIG. 12. FIG. 12 is a perspective view illustrating a construction of a computer 1200.

Figure 12:
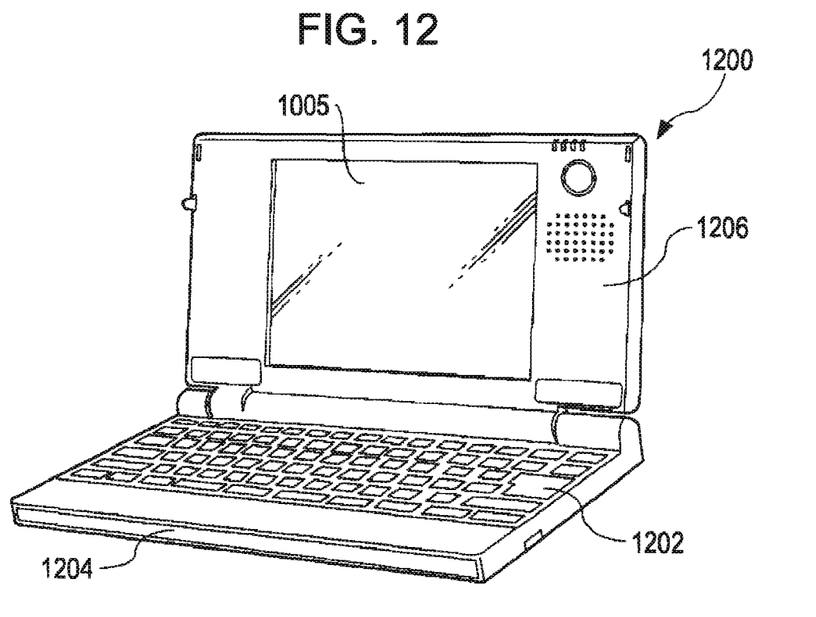
FIG. 12 is a perspective view illustrating an electronic device having an organic electroluminescent device according to the invention.

Referring to FIG. 12, the computer 1200 includes a main body 1204 having a keyboard set 1202 and a display assembly 1206 having a display unit 1005 constructed of an organic electroluminescent device (not shown in the drawing). Since the display unit 1005 has a flat organic electroluminescent layer, it is possible to display a high quality image. In addition, since each pixel on the panel has a flat organic electroluminescent layer, it is possible to display a high quality image on a large screen even when the size of the display unit 1005 is enlarged. In addition, since organic electroluminescent elements capable of emitting the light of three primary colors including red, green, and blue colors are formed on a plurality of organic electroluminescent display panels provided in the display unit 1005, the display unit 1005 can display a full color image.

B: Mobile Phone

A mobile phone as an application of the aforementioned organic electroluminescent device will be described with reference to FIG. 13. FIG. 13 is a perspective view illustrating a construction of the mobile phone 1300.

Figure 13:
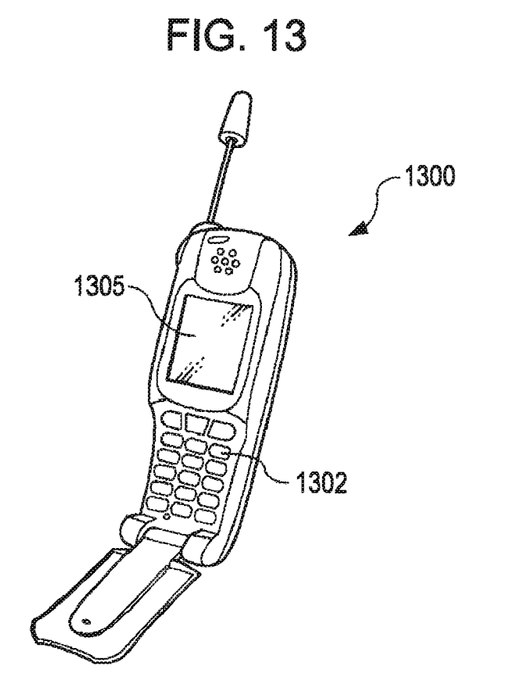
FIG. 13 is a perspective view illustrating another electronic device having an organic electroluminescent device according to the invention.

Referring to FIG. 13, the mobile phone 1300 includes a plurality of manipulation buttons 1302 and a display unit 1305 having an organic electroluminescent device according an embodiment of the invention.

Since the display unit 1305 has a flat organic electroluminescent layer, it is possible to display a high quality image. In addition, since a plurality of organic electroluminescent elements provided in the display unit 1305 emit the light of three primary colors including red, green, and blue colors, the display unit 1305 can display a full color image.

While the invention have been particularly shown and described with reference to exemplary embodiments thereof, it will be understood by those skilled in the art that various changes and modifications may be made therein without departing from the spirit and scope of the invention. An electronic electroluminescent device and an optical device having such changes or modifications should be considered to be included in a technical scope of the invention.

What is claimed is:

1. An organic electroluminescent device comprising:
   a panel;
   a partition that defines a plurality of hollows arranged in an anisotropic shape in a plan view on the panel, the partition includes a first bank portion and a second bank portion, the second bank portion being formed on the first bank portion and having a base portion that contacts the first bank portion, the second bank having a tapered shape that is gradually thinner as elevated in a direction away from the first bank;
   a luminescent portion formed by individually coating a coating solution containing an electroluminescent material on each of the plurality of hollows and drying out the coating solution coated on the hollows; and
   a drain tunnel that is formed in the base portion of the second bank portion of the partition to drain part of the coating solution coated on the hollow so that a surface of the luminescent portion can be flattened.

2. The organic electroluminescent device according to claim 1, wherein the drain tunnel is connected to the coating solution through a side wall surface of the partition.

3. The organic electroluminescent device according to claim 2, wherein an area of a first side wall surface extending along a lateral direction of the hollow is smaller than that of a second side wall surface extending along a longitudinal direction of the hollow, and
   wherein the drain tunnel is connected from the first side wall surface to the coating solution.

4. The organic electroluminescent device according to claim 3, wherein the drain tunnel extends in the partition along the longitudinal direction to open the first side wall surface, and wherein the coating solution is drained from the hollow through the tunnel.

* * * * *